US006204101B1

(12) United States Patent
Yamazaki et al.

(10) Patent No.: US 6,204,101 B1
(45) Date of Patent: Mar. 20, 2001

(54) METHOD OF MANUFACTURING SEMICONDUCTOR DEVICE

(75) Inventors: Shunpei Yamazaki, Tokyo; Satoshi Teramoto, Kanagawa; Jun Koyama, Kanagawa; Akiharu Miyanaga, Kanagawa, all of (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 09/208,101

(22) Filed: Nov. 20, 1998

Related U.S. Application Data

(63) Continuation of application No. 08/767,315, filed on Dec. 16, 1997, now Pat. No. 5,869,363.

(30) Foreign Application Priority Data

Dec. 15, 1995 (JP) .................................................. 7-347820

(51) Int. Cl.⁷ .............................. H01L 21/20; H01L 21/00
(52) U.S. Cl. .......................... 438/166; 438/406; 438/458
(58) Field of Search ................................... 438/166, 406, 438/458, 477, 769

(56) References Cited

U.S. PATENT DOCUMENTS

| | | | |
|---|---|---|---|
| 5,403,772 | 4/1995 | Zhang et al. | 437/101 |
| 5,426,064 | 6/1995 | Zhang et al. | 437/40 |
| 5,481,121 | 1/1996 | Zhang et al. | 257/64 |
| 5,488,000 | 1/1996 | Zhang et al. | 437/21 |
| 5,492,843 | 2/1996 | Adachi et al. | 437/21 |
| 5,501,989 | 3/1996 | Takayama et al. | 437/21 |
| 5,508,533 | 4/1996 | Takemura | 257/64 |
| 5,529,937 | 6/1996 | Zhang et al. | 437/10 |
| 5,534,716 | 7/1996 | Takemura | 257/72 |
| 5,543,352 | 8/1996 | Ohtani et al. | 437/101 |
| 5,563,426 | 10/1996 | Zhang et al. | 257/66 |
| 5,569,610 | 10/1996 | Zhang et al. | 437/21 |
| 5,569,936 | 10/1996 | Zhang et al. | 257/66 |
| 5,580,792 | 12/1996 | Zhang et al. | 437/10 |
| 5,585,291 | 12/1996 | Ohtani et al. | 437/40 |
| 5,589,694 | 12/1996 | Takayama et al. | 257/67 |
| 5,595,923 | 1/1997 | Zhang et al. | 437/41 |
| 5,595,944 | 1/1997 | Zhang et al. | 437/41 |
| 5,604,360 | 2/1997 | Zhang et al. | 257/72 |
| 5,605,846 | 2/1997 | Ohtani et al. | 437/21 |
| 5,605,847 | * 2/1997 | Zhang | 437/24 |
| 5,606,179 | 2/1997 | Yamazaki et al. | 257/59 |
| 5,608,232 | 3/1997 | Yamazaki et al. | 257/66 |
| 5,612,250 | 3/1997 | Ohtani et al. | 437/101 |
| 5,614,426 | 3/1997 | Funada et al. | 437/40 |
| 5,614,733 | 3/1997 | Zhang et al. | 257/66 |
| 5,616,506 | 4/1997 | Takemura | 438/150 |
| 5,620,910 | 4/1997 | Teramoto | 438/151 |
| 5,621,224 | 4/1997 | Yamazaki et al. | 257/66 |
| 5,624,851 | 4/1997 | Takayama et al. | 438/166 |
| 5,637,515 | 6/1997 | Takemura | 438/162 |
| 5,639,698 | 6/1997 | Yamazaki et al. | 437/228 |
| 5,643,826 | 7/1997 | Ohtani et al. | 437/88 |
| 5,646,424 | 7/1997 | Zhang et al. | 257/66 |

(List continued on next page.)

FOREIGN PATENT DOCUMENTS

| | | | |
|---|---|---|---|
| 6-232059 | 2/1993 | (JP) | 21/205 |
| 6-232069 | 2/1993 | (JP) | 21/268 |

*Primary Examiner*—Richard Elms
*Assistant Examiner*—Michael S. Lebentritt
(74) *Attorney, Agent, or Firm*—Fish & Richardson P.C.

(57) ABSTRACT

In a method of manufacturing a semiconductor device, a first heat treatment for crystallization is conducted after nickel elements are introduced in an amorphous silicon film. Then, after the crystalline silicon film is obtained, a heat treatment is again conducted through the heating method which is identical with the first heat treatment. In this state, HCl or the like is added to the atmosphere to conduct gettering of the nickel elements remaining in the crystalline silicon film. With this process, there can be obtained a crystalline silicon film low in the concentration of the metal elements and high in crystallinity.

31 Claims, 5 Drawing Sheets

U.S. PATENT DOCUMENTS

| | | | |
|---|---|---|---|
| 5,654,203 | 8/1997 | Ohtani et al. | 438/97 |
| 5,656,825 | 8/1997 | Kusumoto et al. | 257/66 |
| 5,663,077 | 9/1997 | Adachi et al. | 438/151 |
| 5,677,549 | 10/1997 | Takayama et al. | 257/66 |
| 5,693,541 * | 12/1997 | Yamazaki et al. | 437/21 |
| 5,696,386 | 12/1997 | Yamazaki | 257/57 |
| 5,696,388 | 12/1997 | Funada et al. | 257/64 |
| 5,700,333 | 12/1997 | Yamazaki et al. | 136/258 |
| 5,705,829 | 1/1998 | Miyanaga et al. | 257/66 |
| 5,712,191 | 1/1998 | Nakajima et al. | 437/174 |
| 5,821,138 * | 10/1998 | Yamazaki et al. | 438/166 |
| 5,869,363 * | 2/1999 | Yamazaki et al. | 438/166 |
| 5,985,740 * | 11/1999 | Yamazaki et al. | 438/486 |
| 6,013,929 * | 1/2000 | Ohtani | 257/349 |

* cited by examiner

FORMATION OF AMORPHOUS SILICON FILM

Ni ELEMENT INTRODUCTION

FIRST HEAT TREATMENT FOR CRYSTALLIZATION

SECOND HEAT TREATMENT IN ATMOSPHERE CONTAINING CHLORINE

HEAT TREATMENT FOR CRYSTALLIZATION

HEAT TREATMENT IN ATMOSPHERE CONTAINING CHLORINE

METHOD OF MANUFACTURING SEMICONDUCTOR DEVICE

This is a continuation of U.S. application Ser. No. 08/767,315, filed Dec. 16, 1996 which is now U.S. Pat. No. 5,869,363.

BACKGROUND OF THE INVENTION

1. Field of the Invention

The present invention relates to a method of manufacturing a semiconductor device represented by a thin-film transistor. More particularly, the present invention relates to a method of manufacturing a semiconductor device using a silicon thin film having crystallinity which is formed on a glass substrate or a quartz substrate.

2. Description of the Related Art

Up to now, there have been known thin-film transistors using a silicon film. The thin-film transistor is structured using a silicon film (several hundreds to several thousands Å in thickness) formed on a glass substrate or a quartz substrate.

The reason why the glass substrate or the quartz substrate is used is to employ the thin-film transistor for an active matrix liquid-crystal display unit.

Under existing circumstances, in the case of using the glass substrate, a general technique is that the thin-film transistor is formed using the amorphous silicon film. In the case of using the quartz substrate, a technique in which the crystalline silicon film obtained through a heat treatment is used has been put to practical use.

Compared with the thin-film transistor using the amorphous silicon film, the thin-film transistor using a crystalline silicon film enables high-speed operation of two digits or more to be performed. Hence, a peripheral drive circuit of the active matrix liquid-crystal display unit, which has been conventionally made up of an IC circuit externally attached hereto can be formed of a thin-film transistor on the glass substrate or the quartz substrate.

The above structure is very advantageous in the downsizing of the overall device or simplification of a manufacturing process. Also, the structure leads to reduction of the manufacturing costs.

As a technique by which a crystalline silicon film is obtained through a heating treatment, there has been known a technique disclosed in Japanese Patent Unexamined Publication No. Hei 6-232069. According to the technique, a metal element (for example, nickel) that promotes the crystallization of silicon is introduced into an amorphous silicon film so that the crystalline silicon film is obtained through a heat treatment at a lower temperature than a conventional one.

Using that technique, an inexpensive glass substrate as can be used as a substrate, and the crystalline silicon film as obtained can provide crystallinity which can be practically used over a wide area.

However, because the metal element is contained in the film and the control of its introduced amount is subtle, it is proved that there arise problems on the reproducibility and the stability (electric stability of the obtained device).

SUMMARY OF THE INVENTION

The present invention has been made in view of the above circumstances, and therefore an object of the present invention is to provide a technique by which the concentration of metal elements in a crystalline silicon film obtained by using metal elements that promote the crystallization of silicon is lowered.

In order to solve the above problem, according to one aspect of the present invention, there is provided a method of manufacturing a semiconductor device, comprising the steps of: intentionally introducing metal elements that promote crystallization of silicon in an amorphous silicon film to crystalize said amorphous silicon film through a first heat treatment; and conducting a second heat treatment in an atmosphere containing halogen elements therein to intentionally remove said metal elements; wherein said first heat treatment and said second heat treatment are conducted by identical heating means.

In the above method, it is important that the first heat treatment and the second heat treatment are conducted by the identical heating means. This is because in the case where the first heat treatment for diffusing the metal elements in the silicon film to conduct crystallization and the second heat treatment for removing the metal elements diffused in the silicon film are conducted through an identical method, the removal of the metal elements is carried out more effectively.

For example, in the case of using nickel as the metal elements, conducting the first heat treatment through a heating by a heater, and conducting the second heat treatment through heating by an infrared ray lamp (RTA: rapid thermal annealing), it is proved that the effect of removing nickel from the silicon film is lower than that in the case of using the heater in both of the heating methods.

According to another aspect of the present invention, there is provided a method of manufacturing a semiconductor device, comprising the steps of: holding metal elements that promote crystallization of silicon in contact with a front surface or a rear surface of an amorphous silicon film; conducting a first heat treatment on said amorphous silicon film to crystallize at least a part of said amorphous silicon film; and conducting a second heat treatment in an atmosphere containing halogen elements on the silicon film to intentionally remove said metal elements, wherein the first heat treatment and the second heat treatment are conducted by the identical heating means.

As metal elements that promote crystallization of silicon, there can be used one kind or a plurality of kinds selected from Fe, Co, Ni, Ru, Rh, Pd, Os, Ir, Pt, Cu and Au.

In particular, the use of Ni (nickel) is most preferable from the viewpoint of its effect and reproducibility.

As an atmosphere containing halogen elements therein, there can be used one kind of gas or a plurality of kinds of gases selected from HCl, HF, HBr, $Cl_2$, $F_2$ and $Br_2$ being added to the atmosphere containing one kind of gas or a plurality of gases selected from Ar, $N_2$, He and Ne. In this example, halogen elements function to remove the metal elements.

Also, as an atmosphere containing halogen elements therein, there can be used oxygen and one kind of gas or a plurality of kinds of gases selected from HCl, HF, HBr, $Cl_2$, $F_2$ and $Br_2$ being added to the atmosphere containing one kind of gas or a plurality of gases selected from Ar, $N_2$, He and Ne.

Oxygen has a function to suppress the surface of the silicon film from being roughened by action of halogen elements since oxygen forms the oxide film on the surface of the silicon film simultaneously during the process of removing the metal elements.

The heat treatment for removing the metal elements can be conducted at a temperature of 450 to 1050° C.

With intentional introduction of the metal elements represented by nickel, the amorphous silicon film is crystallized through the first heat treatment. Then, the second heat treatment is conducted in the atmosphere containing halogen elements, to thereby remove the metal elements intentionally introduced from the film. In this situation, the first heat treatment and the second heat treatment may be conducted by the identical means.

The above and other objects and features of the present invention will be more apparent from the following description taken in conjunction with the accompanying drawings.

DETAILED DESCRIPTION OF THE PREFERRED EMBODIMENTS

Now, a description will be given of preferred embodiments of the present invention with reference to the accompanying drawings.

First Embodiment

A first embodiment of the present invention exhibits a technique in which a crystalline silicon film is formed on a glass substrate using nickel elements.

FIGS. 1A to 1D show a manufacturing process in accordance with this embodiment of the present invention. First, a silicon oxynitride film 102 is formed in thickness of 3000 Å on a Corning 1737 glass substrate (strain point of 667° C.) 101 as an under layer.

The formation of the silicon oxynitride film is conducted through the plasma CVD method using silane, $N_2O$ gas and oxygen as a raw gas. Alternatively, the formation is conducted through the plasma CVD method using TEOS gas and $N_2O$ gas.

The silicon oxynitride film functions to prevent impurities (the glass substrate contains a large amount of impurities from the viewpoint of a level in manufacturing a semiconductor device) from being diffused from the glass substrate during the post-process.

It should be noted that a silicon nitride film is optimum in obtaining that function at maximum. However, since the silicon nitride is separated from the glass substrate due to a stress, it is not practically used. Also, a silicon oxide film may be used as the under film. However, the silicon oxide film has an insufficient barrier effect with respect to the impurities in comparison with the silicon oxynitride film.

It is important that the under layer has the hardness as high as possible. This is concluded from the fact that in the endurance test of the thin-film transistor as finally obtained, the harder under layer (that is, the under layer smaller in its etching rate) is higher in reliability. Also, it is presumed from that conclusion that the hardness of the under film is relevant to the prevention of the impurities' entering from the glass substrate.

Then, an amorphous silicon film 103 which will be formed into a crystalline silicon film is formed in thickness of 500 Å through the low pressure thermal CVD method. The reason why the low pressure thermal CVD method is used is that the quality of the crystalline silicon film which will be obtained later is excellent. It should be noted that the plasma CVD method can be used as a method other than the low pressure thermal CVD method.

It is preferable that the thickness of the amorphous silicon film 103 is set to 2000 Å or less. This is because in a stage where metal elements that promote the crystallization of silicon are removed, if its thickness is set to 2000 Å or more, its removal becomes difficult.

Also, the lower limit of the thickness of the amorphous silicon film 103 is determined by how thin the film can be formed in the film formation. In general, about 100 to 200 Å is its lower limit.

Figure 1A:
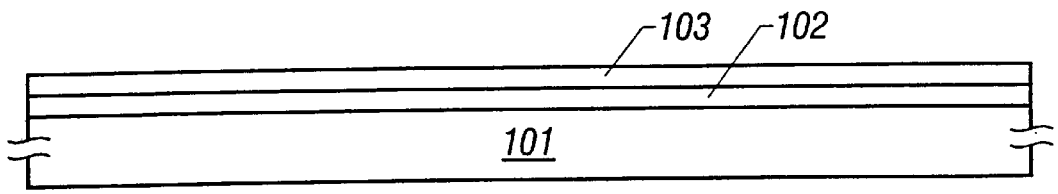
FIGS. 1A to 1D are diagrams showing a process of obtaining a crystalline silicon film.

Also, it is important that the impurities are prevented from mixedly entering the film with the greatest care. Specifically, it is important that attention is paid to the purity of gas used for forming a film and cleaning of the device. In the above manner, a state shown in FIG. 1A is obtained.

Subsequently, a nickel acetate solution containing nickel elements therein of 10 ppm (weight conversion) is coated on the surface of the amorphous silicon film 103.

Figure 1B:
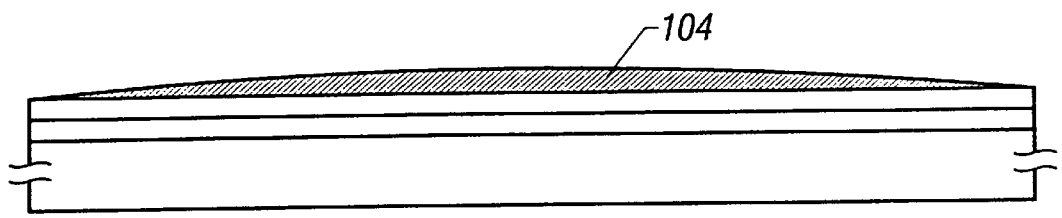

Specifically, as shown in FIG. 1B, a water film 104 of the nickel acetate solution is formed on the surface of the amorphous silicon film 103. Then, an excessive solution of the nickel acetate solution is blown off using a spin coater. That is, spin drying is conducted.

With the above process, there is obtained a state in which the nickel elements are held in contact with the surface of the amorphous silicon film 103.

It should be noted that from the viewpoint of the remaining impurities in the following heating process, it is preferable to use nickel sulfate instead of nickel acetate solution. This is because nickel acetate solution contains carbon, and the carbon may be carbonized during the subsequent heating process and remain in the film.

The adjustment of the amount of introduced nickel elements can be conducted by adjusting the concentration of the nickel elements in the solution. Also, the amount of introduced nickel elements can be controlled in accordance with a condition under which spin drying is conducted and a holding time of the solution on the amorphous silicon film 103.

Figure 1C:
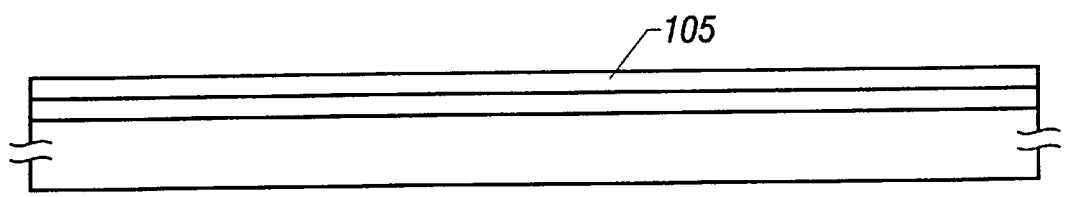

Then, in a state shown in FIG. 1C, a heat treatment is conducted at a temperature of 450 to 650° C. to crystallize the amorphous silicon film 103.

In this step, the heat treatment is conducted at 600° C. in the nitrogen atmosphere for four hours. As a result of this process, a crystalline silicon film 105 is obtained.

It is important that the upper limit of heating temperature in the heat treatment is determined in accordance with the heat resistance of the substrate to be used. In this embodiment, since the Corning 1737 glass substrate whose strain point is 667° C. is used, the condition of the heating temperature is about 650° C. Also, it is proved by experiments that the heating temperature of 450° C. or higher is required for crystallization.

Furthermore, in the case of using a quartz substrate or another material high in heat resistance as a substrate, the heating temperature for the above crystallization can be further increased. For example, in the case of using the quartz substrate, the heating temperature can be increased up to about 1000° C.

The increase in the temperature leads to such advantages that a period required for the heat treatment can be shortened, and also higher crystallinity can be obtained.

In the above crystallization process, the nickel elements which have been held in contact with the surface of the amorphous silicon film 103 are dispersed in the film. Then, this largely contributes to the crystallization of the amorphous silicon film 103.

Figure 1D:
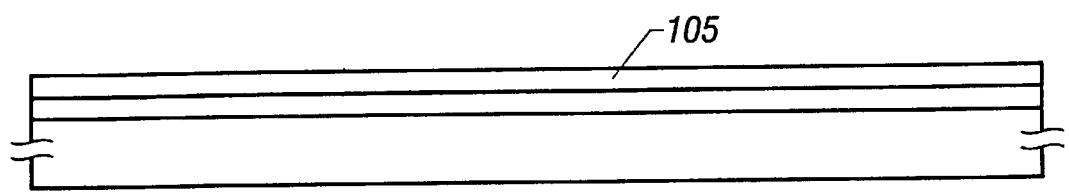

Subsequently, as shown in FIG. 1D, a heat process for removing the nickel elements that have remained in the crystalline silicon film 105 and have been used for crystallization is conducted. The heat treatment is conducted at a temperature of 600° C. in the nitrogen atmosphere containing halogen elements.

In this example, the heat treatment is conducted at 600° C. for 10 minutes in the atmosphere where 3% of HCl is added to the nitrogen atmosphere.

The concentration of HCl in the atmosphere is preferably set to 1 to 10%. If the concentration is set to a value more than that range, attention must be paid because the surface of the silicon film is roughened. If the concentration is set to a value less than that range, the gettering effect is lowered.

Further, it is effective to add oxygen to the atmosphere under which the above heat treatment is conducted. In this case, the rough surface of the silicon film due to the halogen elements is flattened by the formation of the oxide film. The amount of addition of oxygen may be adjusted so that the concentration of oxygen in the atmosphere becomes 20 to 50%.

Also, the lower limit of the above heat treatment temperature is preferably set to 450° C. or higher from the viewpoint of its effect and reproducibility. Also, it is important that its upper limit is set to the strain point of the glass substrate 101 to be used or less.

Hence, the use of the quartz substrate enables the heating temperature to further increase up to about 1000° C. In this case, the effect of removing the nickel elements can be further enhanced. Also, the processing period can be shortened.

However, since the etching effect on the silicon film is remarkable, it is required that the concentration of the halogen elements is lowered, and that oxygen is added thereto.

A gas which is generally called "inactive gas" can be used other than the nitrogen atmosphere. In particular, one kind or a plurality of gases selected from Ar, He and Ne can be used.

As a gas for introducing the halogen elements, one kind or a plurality of gases selected from HF, HBr, $Cl_2$, $F_2$, $Br_2$, and $NF_3$, $ClF_3$ can be used other than HCl. It is preferable that the content (volume content) of the gas in the atmosphere are set to 0.3 to 10% if it is HF, 1 to 20% if it is HBr, 0.3 to 5% if it is $Cl_2$, 1 to 3% if it is $F_2$, and 0.3 to 10% if it is $Br_2$.

By the heat treatment which has been again conducted in the above atmosphere containing the halogen elements as described above, the concentration of the nickel elements can be set to 1/10 of an initial concentration, or less. This means that the nickel elements can be set to 1/10 or less in comparison with a case in which gettering due to the halogen elements is not conducted. The effect is obtained similarly in the case of using other metal elements.

For example, in the crystalline silicon film which has been crystallized through the heat treatment in the nitrogen atmosphere using the nickel elements, the nickel elements have been observed at a concentration of about $1 \times 10^{19}$ to $5 \times 10^{19}$ $cm^{-3}$ through the measurement of SIMS (secondary ion mass spectrometry).

On the contrary, in the case of applying this embodiment, the concentration of detected nickel is about $1 \times 10^{18}$ to $5 \times 10^{18}$ $cm^{-3}$. Of course, it is presumed that the condition under which nickel is introduced is identical.

It should be noted that in this embodiment, there is shown an example in which solution is used to introduce nickel elements from the viewpoints of the excellent controllability and simpleness. However, there may be used a method of forming nickel or a film containing nickel through the CVD method or the sputtering method. Also, there may be used a method of holding the nickel elements in contact with surface of the amorphous silicon film through the adsorption method.

Likewise, this is applied to a case of using other metal elements that promote the crystallization of silicon.

Second Embodiment

A second embodiment of the present invention relates to an example of conducting the crystal growth different in form from the first embodiment. This embodiment relates to a method of conducting crystal growth in a direction parallel to a substrate, which is called "lateral growth", using metal elements that promote the crystallization of silicon.

FIGS. 2A to 2D show a manufacturing process in accordance with this embodiment. First, a silicon oxynitride film 202 is formed in thickness of 3000 Å on a Corning 1737 glass substrate (it may be a quartz substrate) as an under layer.

An amorphous silicon film 203 is formed in thickness of 500 Å through the low pressure thermal CVD method.

Then, a silicon oxide film not shown is formed in thickness of 1500 Å, and then patterned to form a mask indicated by reference numeral 204. An opening is formed on the mask in a region indicated by 205, and the amorphous silicon film 203 which is an under layer is exposed at that region.

The opening 205 has a slender rectangle which extend longitudinally depthwise of the drawing. The width of the opening 205 may be set to 20 $\mu$m or more. The length in the longitudinal direction may be arbitrarily determined.

The nickel acetate solution containing the nickel elements of 10 ppm in weight conversion shown in the first embodiment is coated thereon. Then, an excessive solution is blown off using a spin coater.

Figure 2A:
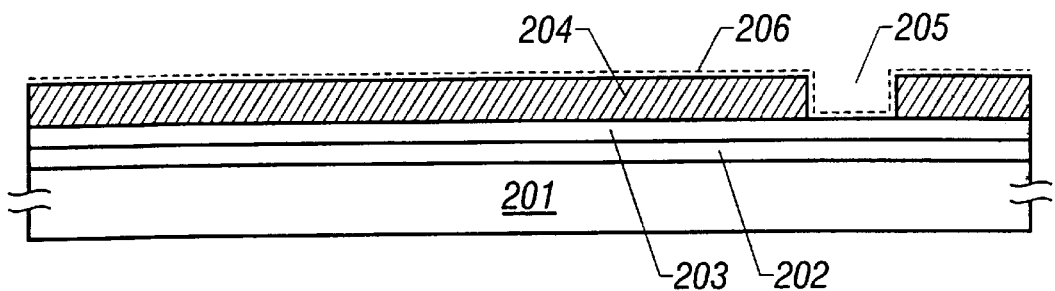
FIGS. 2A to 2D are diagrams showing a process of obtaining a crystalline silicon film.

In the above manner, as indicated by a dotted line 206, the nickel elements are held in contact with the exposed surface of the amorphous silicon film 203 and the surface of the mask 204 which is the silicon oxide film (FIG. 2A).

Subsequently, a heat treatment is conducted at 600° C. for 4 hours in the nitrogen atmosphere containing no oxygen as much as possible. With this process, crystal growth in parallel with the substrate is progressed as indicated by reference numeral 207 in FIG. 2B. The crystal growth is progressed from the region of the opening 205 into which the nickel elements have been introduced toward the periphery. The crystal growth directed in parallel with the substrate is called "lateral growth".

Figure 2B:
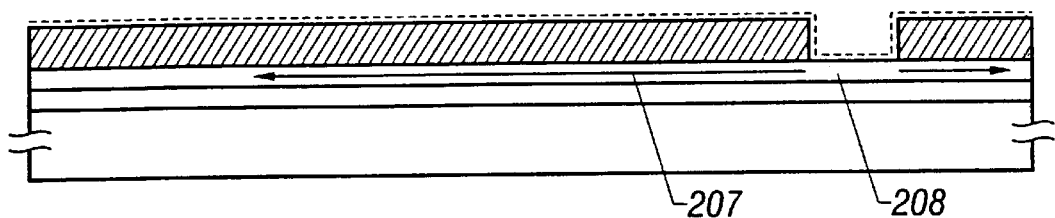

The lateral growth can be conducted over 100 $\mu$m or more. A silicon film 208 thus having the lateral region is obtained (FIG. 2B).

Figure 2C:
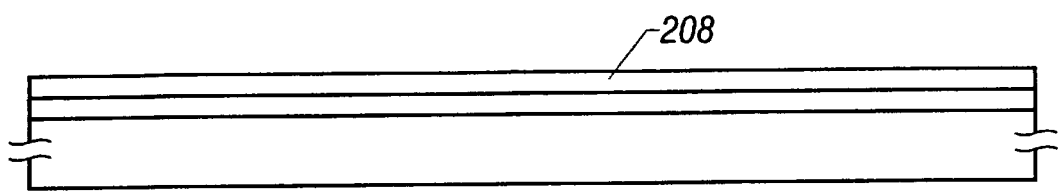
Figure 2D:
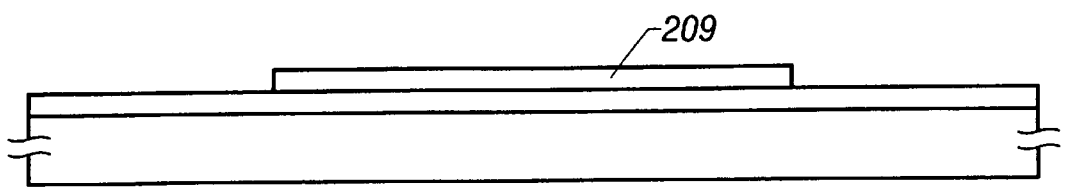

Then, the mask 204 which is the silicon oxide film for selectively introducing the nickel elements is removed to obtain a state shown in FIG. 2C. In this state, the lateral growth region and a region (having an amorphous silicon state) which is not subjected to crystal growth exist in the silicon film 208.

Then, in this state, a heating treatment is conducted at 600° C. for 10 minutes in the atmosphere comprising 5% of HCl, 5% of oxygen and 90% of nitrogen.

With this process, as described in the first embodiment, the concentration of the nickel elements in the film can be reduced.

Subsequently, a pattern 209 which is the lateral growth region is formed by patterning. In this example, it is important that the pattern 209 is designed such that a start point and an end point of the crystal growth do not exist in the pattern 209.

This is because the nickel elements of a relatively high concentration are contained in the start point and the end point of the crystal growth.

The concentration of the nickel elements remaining in the pattern 209 thus obtained which is the lateral growth region can be set to be further lower compared with the case of the first embodiment.

This is also because the concentration of the metal elements contained in the lateral growth region is originally low. Specifically, the concentration of the nickel elements in the pattern 209 which is the lateral growth region can be set to the order of $10^{17}$ cm$^{-3}$.

Also, the device is designed in such a manner that the lateral growth direction and the carrier moving direction are substantially identical with each other, thereby being capable of obtaining the device having a higher mobility compared with the case of using the crystal growth method shown in the first embodiment.

Third Embodiment

A third embodiment of the present invention exhibits an example of manufacturing a thin-film transistor disposed in a pixel region of an active matrix type liquid-crystal display unit or an active matrix type EL display unit.

FIGS. 3A to 3E show a manufacturing process in accordance with this embodiment. First, a crystalline silicon film is formed on a glass substrate through the process shown in the first embodiment or the second embodiment. Then, the crystalline silicon film is patterned to obtain a state shown in FIG. 3A.

Figure 3A:
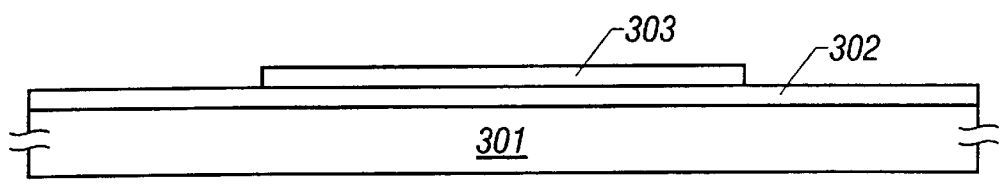
FIGS. 3A to 3E are diagrams showing a process of manufacturing a thin-film transistor.

In the state shown in FIG. 3A, reference numeral 301 denotes a glass substrate; 302, an under film; and 303, an active layer formed of a crystalline silicon film. In this example, it is preferable that the under film is formed of a silicon oxynitride film. Also, it is desirable that halogen elements are contained in the silicon oxynitride film. This is because the gettering operation of the metal ions and movable ions due to halogen elements is used.

After the state shown in FIG. 3A is obtained, a silicon oxynitride film 304 forming a gate insulation film is formed in thickness of 1000 Å. The film forming method is plasma CVD method using a mixture gas consisting of oxygen, silane and N$_2$O, or plasma CVD method using a mixture gas consisting of TEOS and N$_2$O.

Also, that the halogen elements are contained in the silicon oxynitride film is useful in prevention of the function of the gate insulation film as an insulation film from being deteriorated by the influence of the nickel elements (other metal elements that promote the crystallization of silicon) which exist in the active layer.

The formation of the silicon oxynitride film has significance in that the metal elements are hard to enter in the gate insulation film due to its fine quality of the film. If the metal elements enter in the gate insulation film, its function as the insulation film is deteriorated, causing the instability and the dispersion of the characteristics of the thin-film transistor.

It should be noted that a silicon oxynitride film normally used can be used for the gate insulation film.

After the silicon oxynitride film 304 that functions as the gate insulation film has been formed, an aluminum film (not shown) which will function as a gate electrode later is formed through the sputtering method. 0.2 wt % of scandium is contained in the aluminum film.

The reason why 0.2 wt % of scandium is contained in the aluminum film is to suppress occurring of hillock or whisker in the subsequent process. Hillock and whisker are directed to a needle-like projection generated by heating. It is considered that the hillock and the whisker are caused by the abnormal growth of aluminum.

After the formation of the aluminum film, a dense anodic oxide film not shown is formed. The anodic oxide film is formed using an ethylene glycol solution containing tartaric acid of 3% as an electrolyte solution.

The anodic oxidization is conducted with the aluminum film as an anode and platinum as a cathode in the electrolyte solution, to thereby form the dense anodic oxide film on the surface of the aluminum film.

The thickness of the dense anodic oxide film not shown is set to about 100 Å. The anodic oxide film serves to improve the adhesion to a resist mask which will be formed later.

It should be noted that the thickness of the anodic oxide film can be controlled by a supply voltage when anodic oxidizing.

Figure 3B:
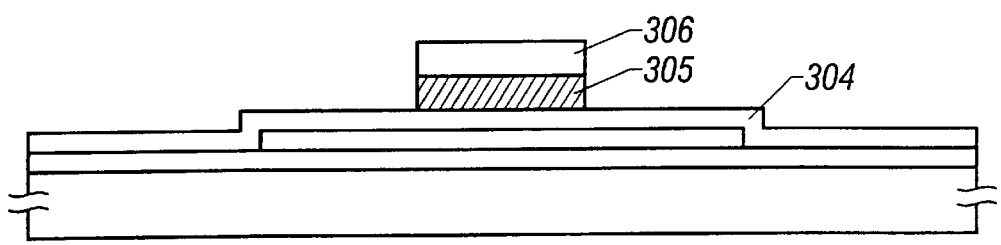

Thereafter, a resist mask 306 is formed. Then, an aluminum film 305 is patterned in a pattern indicated by reference numeral 305. In this way, a state shown in FIG. 3B is obtained.

In this situation, anodic oxidization is again conducted. In this example, an oxalic acid aqueous solution of 3% is used as the electrolyte solution. Anodic oxidization is conducted with the pattern 305 of aluminum as the anode in the electrolyte solution, to thereby form a porous anodic oxide film indicated by reference numeral 308.

In this process, because the resist mask 306 high in adhesion exists in the upper portion, an anodic oxide film 308 is selectively formed on the side surfaces of the aluminum pattern.

The anodic oxide film 308 can grow up to several μm in thickness. In this example, its thickness is set to 6000 Å. It should be noted that the growth distance can be controlled by anodic oxidation period.

Figure 3C:
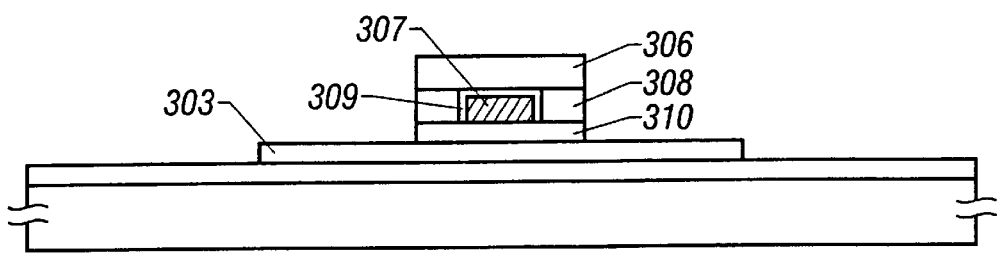

Then, a dense anodic oxide film is again formed. In other words, using the above-mentioned ethylene glycol solution containing 3% of tartaric acid as an electrolyte solution, anodic oxidization is again conducted. As a result, because the electrolyte solution enters in the porous anodic oxide film 308, a dense anodic oxide film as indicated by reference numeral 309 is formed. The thickness of the dense anodic oxidation film 309 is set to 1000 Å (FIG. 3C).

In this example, the exposed portion of the silicon oxynitride film 304 is etched. It is useful to utilize the dry etching as that etching. Further, the porous anodic oxide film 308 is removed by a mixture acid consisting of acetic acid, nitric acid and phosphoric acid. In this way, a state shown in FIG. 3D is obtained.

Figure 3D:
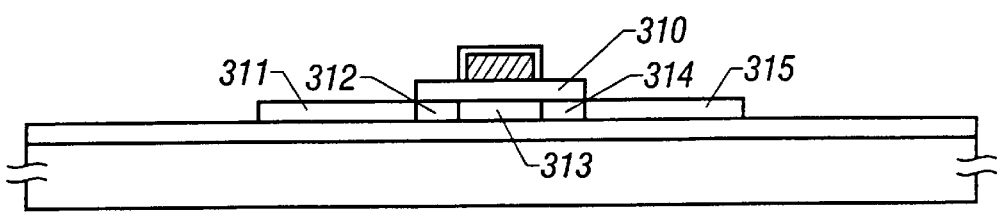

After the state shown in FIG. 3D is obtained, the implantation of impurity ions is conducted. In this example, in order to manufacture the n-channel type thin-film transistor, the implantation of P (phosphorus) ions is conducted through the plasma doping method.

In this process, heavy doped regions 311 and 315 and light doped regions 312 and 314 are formed, respectively. This is because a part of the remaining silicon oxynitride film 310 functions as a translucent mask, and a part of implanted ions is shielded there.

Thereafter, a laser beam or an intense light is irradiated thereon, to thereby activate a region in which the impurity ions have been implanted. In this way, a source region 311, a channel formation region 313, a drain region 315, and low-density impurity regions 312 and 314 are formed in a self-alignment manner.

In this example, what is indicated by reference numeral 314 is a region which is called "LDD (light doped drain) (FIG. 3D).

It should be noted that in the case where the thickness of the dense anodic oxide film 309 is thickened to 2000 Å or more, the thickness allows an offset gate region to be formed outside of the channel formation region 313.

Similarly, in this embodiment, although the offset gate region is formed, since its dimensions are small so that the contribution of the offset gate region is small, and in order to avoid complicating the drawing, it is not shown in the figure.

Thereafter, a silicon oxide film, a silicon nitride film or a laminate film thereof is formed as an interlayer insulation film 316. The interlayer insulation film 316 may be constituted by a layer made of a resin material on the silicon oxide film or the silicon nitride film.

Figure 3E:
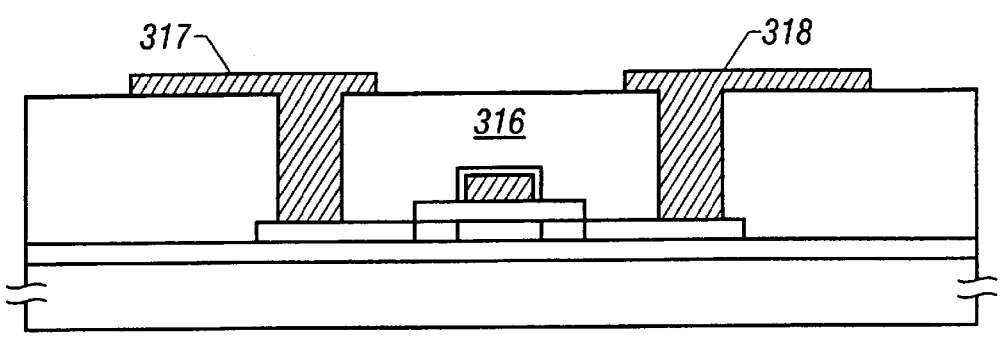

Then, contact holes are defined to form a source electrode 317 and a drain electrode 318. In this way, a thin-film transistor shown in FIG. 3E is completed.

Fourth Embodiment

A fourth embodiment of the present invention relates to a method of forming a gate insulation film 304 in the structure shown in the third embodiment. In the case of using a quartz substrate or a glass substrate high in heat resistance, it is preferable that the thermal oxidation method is used as a method of forming the gate insulation film.

Since the oxide film formed through the thermal oxidation method is fine (dense) as the insulation film and does not contain charges internally movable therein, it is one of optimum gate insulation films.

As a method of forming the thermal oxide film, there can be recited an example of processing in the oxide atmosphere at a temperature of 950° C.

In this situation, it is effective to mix HCl or the like in the oxide atmosphere. With this process, the metal elements that exist in the active layer can be removed while the thermal oxide film is being formed.

Also, it is effective that $N_2O$ gas is mixed in the oxide atmosphere to form a thermal oxide film containing a nitrogen component. In this example, if the mixture ratio of the $N_2O$ gas is optimized, a silicon oxynitride film can be obtained through the thermal oxide method.

In this example, there is shown an example in which the gate insulation film is formed through the thermal oxidation method. However, as another method, the gate insulation film can be formed through the thermal CVD method. Similarly in this case, it is effective that nitrogen component is contained using $N_2O$ and ammonium.

Fifth Embodiment

A fifth embodiment of the present invention shows an example in which a thin-film transistor is manufactured in a process different from that shown in FIGS. 3A to 3E.

FIGS. 4A to 4E show a manufacturing process in accordance with this embodiment. First, a crystalline silicon film is formed on a glass substrate through a process shown in the first embodiment or the second embodiment. Then, it is patterned to obtain a state shown in FIG. 4A.

Figure 4A:
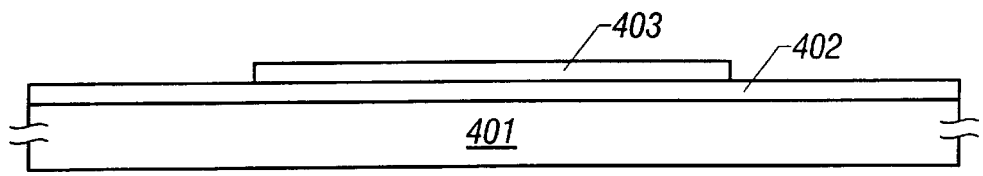
FIGS. 4A to 4E are diagrams showing a process of manufacturing a thin-film transistor.

In the state shown in FIG. 4A, reference numeral 401 denotes a glass substrate; 402, an under film; and 403, an active layer which is made up of a crystalline silicon film. In this example, it is preferable that the under layer 402 is formed of a silicon oxynitride film.

After the state shown in FIG. 4A is obtained, the silicon oxynitride film 404 forming a gate insulation film is formed in thickness of 1000 Å. The film forming method is the plasma CVD method using a mixture gas consisting of oxygen, silane and $N_2O$, or the plasma CVD method using a mixture gas consisting of TEOS and $N_2O$.

It should be noted that a silicon oxide film normally used can be used for the gate insulation film.

After the silicon oxynitride film 404 that functions as the gate insulation film has been formed, an aluminum film (not shown) which will function as a gate electrode later is formed through the sputtering method. 0.2 wt % of scandium is contained in the aluminum film.

After the formation of the aluminum film, a dense anodic oxide film not shown is formed. The anodic oxide film is formed using an ethylene glycol solution containing 3% of tartaric acid as an electrolyte solution. That is, the anodic oxidization is conducted with the aluminum film as an anode and platinum as a cathode in the electrolyte solution, to thereby form the dense anodic oxide film on the surface of the aluminum film.

The thickness of the dense anodic oxide film not shown is set to about 100 Å. The anodic oxide film serves to improve the adhesion to a resist mask which will be formed later.

It should be noted that the thickness of the anodic oxide film can be controlled by a supply voltage when anodic oxidizing.

Thereafter, a resist mask 405 is formed. Then, an aluminum film is patterned in a pattern indicated by reference numeral 406.

In this situation, anodic oxidization is again conducted. In this example, an oxalic acid aqueous solution of 3% is used as the electrolyte solution. Anodic oxidization is conducted with the pattern 406 of aluminum as the anode in the electrolyte solution, to thereby form a porous anodic oxide film indicated by reference numeral 407.

In this process, because the resist mask 405 high in adhesion exists in the upper portion, an anodic oxide film 407 is selectively formed on the side surfaces of the aluminum pattern 406.

The anodic oxide film 407 can grow up to several $\mu$m in thickness. In this example, its thickness is set to 6000 Å. It should be noted that the growth distance can be controlled by anodic oxidation period.

Figure 4B:
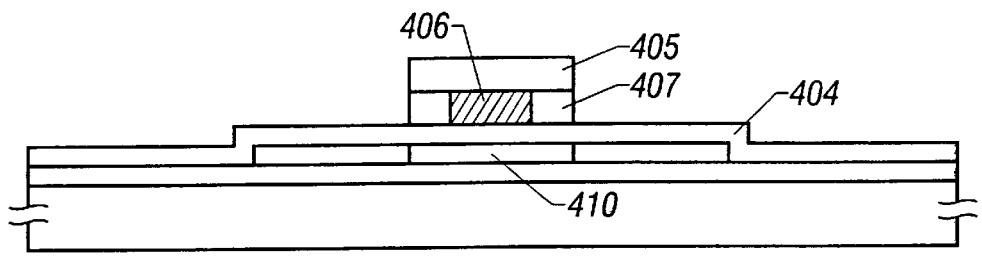

In this way, a state shown in FIG. 4B is obtained. Then, a dense anodic oxide film is again formed. In other words, using the above-mentioned ethylene glycol solution containing 3% of tartaric acid as an electrolyte solution, anodic oxidization is again conducted. As a result, because the electrolyte solution enters in the porous anodic oxide film 407, a dense anodic oxide film as indicated by reference numeral 408 is formed (FIG. 4C).

Figure 4C:
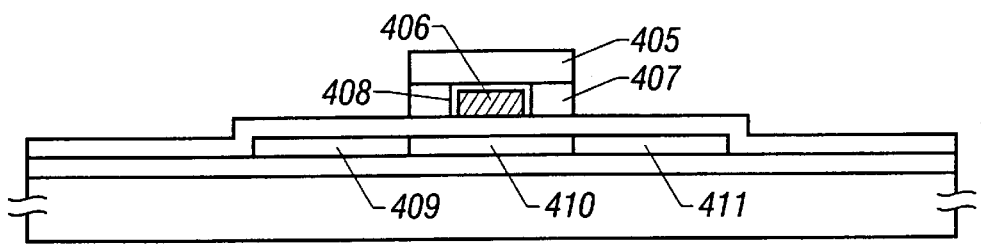

In the state shown in FIG. 4C, the implantation of impurity ions is first conducted. This process may be conducted after the removal of the resist mask 405.

A source region 409 and a drain region 411 are formed through the implantation of the impurity ions. Also, no impurity ions are implanted in a region 410.

Subsequently, the porous anodic oxide film 407 is removed by a mixture acid consisting of acetic acid, nitric acid and phosphoric acid. In this way, a state shown in FIG. 4D is obtained.

Figure 4D:
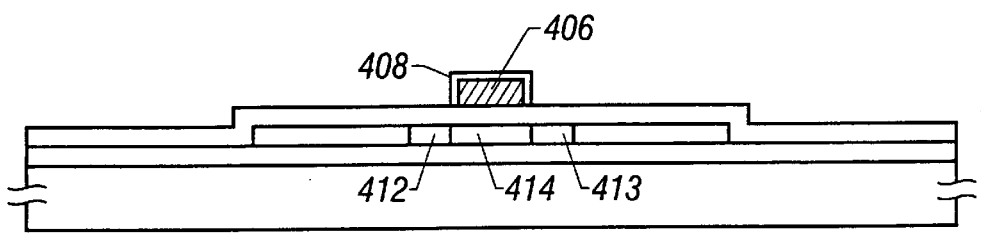

After the state shown in FIG. 4D is obtained, the implantation of impurity ions is again conducted. The impurity ions are implanted under the condition of the light doping from the condition of the initial impurity ion implantation.

In this process, light doped regions 412 and 413 are formed, and then a channel formation region indicated by reference numeral 414 is formed (FIG. 4D).

Thereafter, a laser beam or an intense light is irradiated thereon, to thereby activate a region in which the impurity ions have been implanted. In this way, a source region 409, a channel formation region 410, a drain region 411, and low-density impurity regions 412 and 413 are formed in a self-alignment manner.

In this example, what is indicated by reference numeral 413 is a region which is called "LDD (light doped drain) (FIG. 4D).

Thereafter, a silicon oxide film, a silicon nitride film or a laminate film thereof is formed as an interlayer insulation film 415. The interlayer insulation film 415 is constituted by a layer made of a resin material on the silicon oxide film or the silicon nitride film.

Figure 4E:
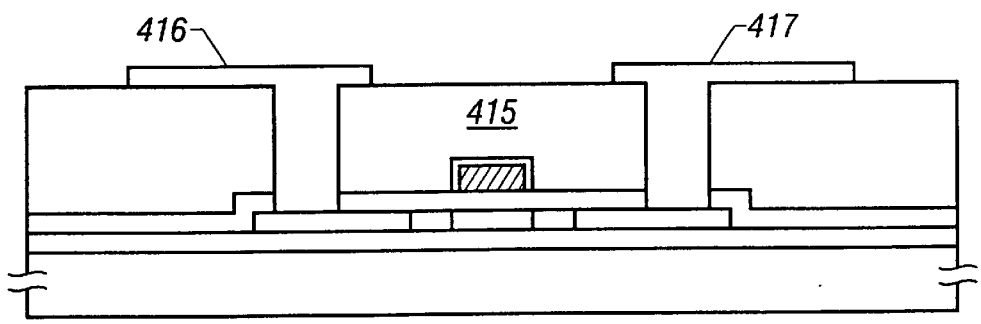

Then, contact holes are defined to form a source electrode 416 and a drain electrode 417. In this way, a thin-film transistor shown in FIG. 4E is completed.

Sixth Embodiment

A sixth embodiment of the present invention relates to an example in which an n-channel type thin-film transistor and a p-channel type thin-film transistor are of a complementary type.

The structure of this embodiment can be used, for example, for a variety of thin-film integrated circuits which are integrated on an insulation surface. Also, it can be used, for example, for a peripheral drive circuit of an active matrix liquid-crystal display unit.

Figure 5A:
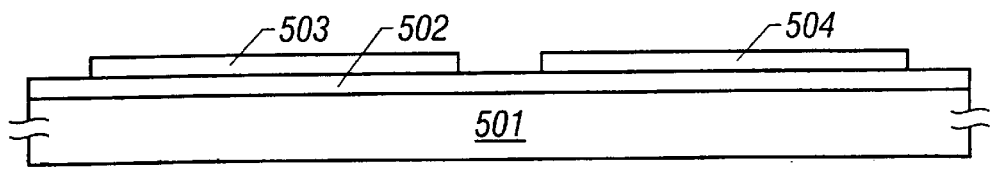
FIGS. 5A to 5F are diagrams showing a process of manufacturing a thin-film transistor.

First, a silicon oxide film or a silicon oxynitride film are formed on a glass substrate 501 as an under layer 502 as shown in FIG. 5A. Preferably, the silicon oxynitride film is used.

Further, an amorphous silicon film not shown is formed through the plasma CVD method or the low pressure thermal CVD method. Further, the amorphous silicon film is formed into a crystalline silicon film through the method described in the first embodiment or the second embodiment.

Then, a crystalline silicon film thus obtained is patterned to obtain active layers 503 and 504. In this manner, a state shown in FIG. 5A is obtained.

Further, a silicon oxynitride film 505 that forms a gate insulation film is formed. In this process, if quartz is used for a substrate, it is preferable to use the above-described thermal oxidation method (FIG. 5A).

An aluminum film (not shown) for constituting a gate electrode later is formed in thickness of 4000 Å. An anodizable metal (for example, tantalum) can be used except for the aluminum film.

After the formation of the aluminum film, a very-thin dense anodic oxide film is formed on the aluminum film through the above-mentioned method.

Subsequently, a resist mask not shown is arranged on the aluminum film, and the aluminum film is patterned. Then, anodic oxidization is conducted with the aluminum pattern thus obtained as an anode, to form porous anodic oxide films 508 and 509. The thickness of the porous anodic oxide films 508 and 509 is set to 5000 Å.

Figure 5B:
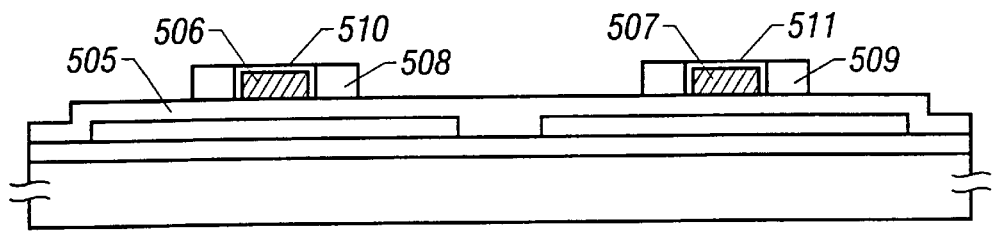

Further, anodic oxidization is again conducted on the condition that a dense anodic oxide film is formed, to form dense anodic films 510 and 511 thereby. The thickness of the anodic oxide films 510 and 511 is set to 800 Å. In this way, a state shown in FIG. 5B is obtained.

Figure 5C:
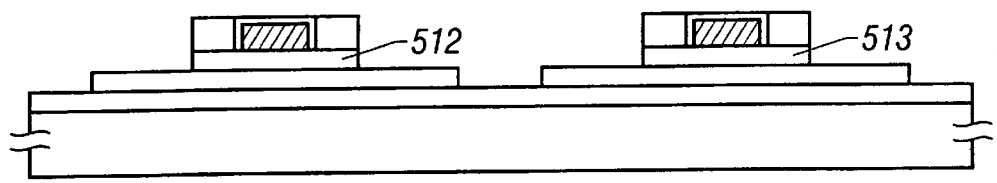

Furthermore, the exposed silicon oxide film 505 is removed by dry etching to obtain gate insulation films 512 and 513 as shown in FIG. 5C.

Figure 5D:
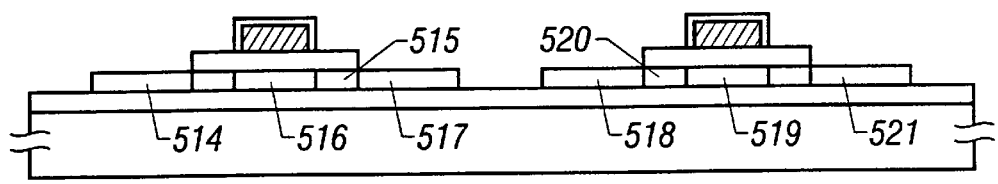

After the formation shown in FIG. 5C is obtained, the porous anodic oxide films 508 and 509 are removed by a mixture acid consisting of acetic acid, nitric acid and phosphoric acid. In this way, a state shown in FIG. 5D is obtained.

In this situation, the resist mask is alternately disposed in such a manner that P ions are implanted in the left-sided thin-film transistor whereas B ions are implanted in the right-sided thin-film transistor.

A source region 514 and a drain region 517 each having n-type with a high concentration are formed in a self-alignment manner.

Also, a region 515 having weak n-type where P ions are doped at a low density is formed simultaneously.

The reason why the region having the weak n-type indicated by reference numeral 515 is formed is that the remaining gate insulation film 512 exists. In other words, the P ions that have transmitted the gate insulation film 512 is partially shielded by the gate insulation film 512.

Also, with the same principle, a source region 521 and a drain region 518 each having a strong p-type are formed in a self-alignment manner. Also, a low-density impurity region 520 is formed simultaneously. Furthermore, a channel formation region 519 is formed simultaneously.

It should be noted that in the case where the dense anodic oxide films 510 and 511 are thickened to the degree of 2000 Å, offset gate regions can be formed in contact with the channel formation regions 516 and 519 by virtue of the thickness.

In this embodiment, since the dense anodic oxide films 510 and 511 are thinned to the thickness of 1000 Å or less, the existence of those films 510 and 511 can be ignored.

Then, a laser beam or an intense light is irradiated thereon to anneal a region in which the impurity ions have been implanted.

Figure 5E:
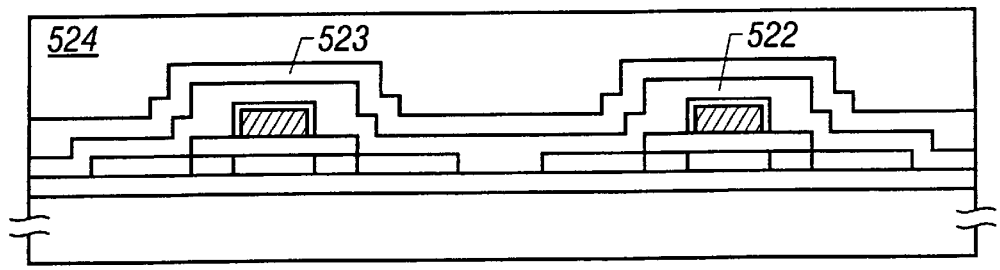
Figure 5F:
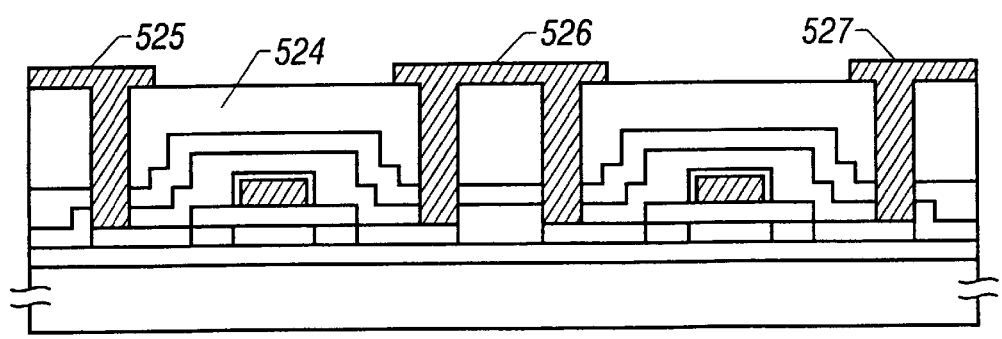

Thereafter, as shown in FIG. 5E, a silicon nitride film 522 and a silicon oxide film 523 are formed as an interlayer insulation film as shown in FIG. 5E. The thickness of the respective films 522 and 523 is set to 1000 Å. It should be noted that the silicon oxide film 523 may not be formed.

In this example, the thin-film transistor is covered with the silicon nitride film 522. Since the silicon nitride film is dense and has an excellent interface characteristic, this structure enables the reliability of the thin-film transistor to be enhanced.

Further, an interlayer insulation film 524 made of a resin material is formed through the spin coating method. In this example, the thickness of the interlayer insulation film 524 is set to 1 μm at the minimum (FIG. 5E).

Then, contact holes are defined to form a source electrode 525 and a drain electrode 526 of the left-sided n-channel type thin-film transistor. Also, a source electrode 527 and a drain electrode 526 of the right-sided thin-film transistor are formed. In this example, the drain electrode 526 is commonly arranged.

In the above manner, the thin-film transistor circuit having a complementary type CMOS structure can be structured.

In the structure of this embodiment, the thin-film transistor is covered with a nitride film and also with a resin material. This structure enables the durability to be enhanced which makes the entrance of movable ions and moisture hard.

Seventh Embodiment

A seventh embodiment of the present invention relates to a structure in which a laser beam is further irradiated on the crystalline silicon film obtained by the first embodiment or the second embodiment, to thereby form a region which is a mono-crystal or a substantially monocrystal.

First, a crystalline silicon film is obtained using the action of nickel elements as described in the first embodiment. Then, an excimer laser (For example, KrF excimer laser) is irradiated on the film to further promote the crystallinity.

The film whose crystallization has been greatly promoted through the above method has a mono-crystal like region which is $3 \times 10^{17}$ cm$^{-3}$ or less in electronic spin density which is measured through ESR, and $3 \times 10^{17}$ cm$^{-3}$ or less in nickel element density as the minimum value measured through SIMS.

The grain boundary does not substantially exist in that region, and a high electric characteristic comparable to the mono-crystal silicon wafer can be obtained.

Also, the mono-crystal like region contains 5 atoms % or less to $1 \times 10^{15}$ cm$^{-3}$ of hydrogen. The value is proved from measurement through SIMS (secondary ion mass spectrometry).

With the manufacturing of the thin-film transistor using the region which is a mono-crystal or a substantially monocrystal, the characteristics comparable to the MOS type transistor manufactured using the mono-crystal wafer can be obtained.

Eighth Embodiment

An eighth embodiment of the present invention exhibits an example in which a gate insulation film is formed through the thermal CVD method in a process of manufacturing the thin-film transistor as shown in FIGS. 3 to 5. In the case of forming the gate insulation film through thermal CVD method, since heating at a high temperature is required, it is desirable to use quartz as a substrate.

In this example, an example is shown in which the gate insulation film is formed through the low pressure thermal CVD method at 850° C., using oxygen gas containing 3% of HCl in volume ratio. The gate insulation film obtained in the above method can make it difficult to change the electric characteristic by the entrance of the metal elements that exist in the active layer.

Ninth Embodiment

A ninth embodiment of the present invention exhibits an example in which nickel elements are introduced directly in the surface of the under layer during a process shown in the first embodiment. In this case, the nickel elements are held in contact with the lower surface of the amorphous silicon film.

As was described above, the present invention can provide a technique of reducing the concentration of the metal elements in the crystalline silicon film obtained using the metal elements that promote the crystallization of silicon.

Also, the present invention can obtain a thin-film semiconductor device higher in reliability and excellent in performance.

The foregoing description of a preferred embodiment of the invention has been presented for purposes of illustration and description. It is not intended to be exhaustive or to limit the invention to the precise form disclosed, and modifications and variations are possible in light of the above teachings or may be acquired from practice of the invention. The embodiment was chosen and described in order to explain the principles of the invention and its practical application to enable one skilled in the art to utilize the invention in various embodiments and with various modifications as are suited to the particular use contemplated. It is intended that the scope of the invention be defined by the claims appended hereto, and their equivalents.

What is claimed is:

1. A method of forming a semiconductor device comprising the steps of:
    preparing an amorphous semiconductor film on an insulating surface;
    performing a first heat treatment to crystallize said amorphous semiconductor film;
    performing a second heat treatment at a higher temperature than said first heat treatment, and in an atmosphere comprising at least a material selected from the group consisting of Ar, N$_2$, He, and Ne,
    wherein said second heat treatment is performed at a temperature of 450–1050° C., and
    wherein said crystallized semiconductor film after said second heat treatment has a spin density in the range of $3 \times 10^{17}$ cm$^{-3}$ or less.

2. A method according to claim 1, wherein said atmosphere in said second heat treatment further comprises a halogen element including at least a material selected from the group consisting of HCl, HF, HBr, Cl$_2$, F$_2$, and Br$_2$.

3. A method according to claim 1, wherein said amorphous semiconductor film comprises a metal element being capable of promoting crystallization of said amorphous semiconductor film.

4. A method according to claim 3, wherein said crystallized semiconductor film after said second heat treatment includes said metal element at $3 \times 10^{17}$ cm$^{-3}$ or less which is measured through SIMS.

5. A method according to claim 3, wherein said second heat treatment is carried out to getter the metal element from the crystallized semiconductor film.

6. A method according to claim 3, wherein said metal element can be reduced ⅒ or less of an initial concentration by said second heat treatment.

7. A method according to claim 1, wherein said first and second treatments are performed by same means.

8. A method according to claim 1, wherein said second treatment is performed for 10 minutes.

9. A method according to claim 1, wherein said spin density is measured by ESR.

10. A method according to claim 1, wherein said semiconductor device is one selected from the group consisting of a liquid crystal display device, an EL display device, and a thin film integrated circuit.

11. A method according to claim 1, wherein said amorphous semiconductor film is an amorphous silicon film formed through a low pressure CVD method or a plasma CVD method.

12. A method of forming a semiconductor device comprising the steps of:

preparing an amorphous semiconductor film on an insulating surface;

crystallizing said amorphous semiconductor film;

heating said crystallized semiconductor film at a higher temperature than said crystallizing step, and in an atmosphere comprising at least a material selected from the group consisting of Ar, $N_2$, He, and Ne; and irradiating said crystallized semiconductor film with a laser light after said heating step, wherein said heating step is carried out at a temperature of 450–1050° C., wherein said crystallized semiconductor film after said heat step has a spin density in the range of $3 \times 10^{17}$ cm$^{-3}$ or less, wherein said crystallized semiconductor film comprises hydrogen at 5 atoms % or less to $1 \times 10^{15}$ cm$^{-3}$.

13. A method according to claim 12, wherein said atmosphere in said heating step further comprises a halogen element including at least a material selected from the group consisting of HCl, HF, HBr, $Cl^2$, $F_2$, and $Br_2$.

14. A method according to claim 12, wherein said amorphous semiconductor film comprises a metal element being capable of promoting crystallization of said amorphous semiconductor film.

15. A method according to claim 14, wherein said crystallized semiconductor film after the heating step includes said metal element $3 \times 10^{17}$ cm$^{-3}$ or less which is measured through SIMS.

16. A method according to claim 14, wherein said metal element can be reduced 1/10 or less of an initial concentration by said heating step.

17. A method according to claim 12, wherein said crystallizing step and said heating step are conducted by same means.

18. A method according to claim 12, wherein said heating step is conducted for 10 minutes.

19. A method according to claim 12, wherein said spin density is measured by ESR.

20. A method according to claim 12, wherein said semiconductor device is one selected from the group consisting of a liquid crystal display device, an EL display device, and a thin film integrated circuit.

21. A method according to claim 12, wherein said amorphous semiconductor film is an amorphous silicon film formed through a low pressure CVD method or a plasma CVD method.

22. A method of forming a semiconductor device comprising the steps of:

preparing an amorphous semiconductor film on an insulating surface;

performing a first heat treatment to crystallize said amorphous semiconductor film;

performing a second heat treatment at a higher temperature than said first heat treatment, and in an atmosphere comprising at least a material selected from the group consisting of Ar, $N_2$, He, and Ne, so that a substantially single crystal semiconductor region having no grain boundary is obtained, wherein said second heat treatment is performed at a temperature of 450–1050° C., and wherein said crystallized semiconductor film after said second heat treatment has a spin density in the range of $3 \times 10^{17}$ cm$^{-3}$ or less.

23. A method according to claim 22, wherein said atmosphere in said second heat treatment further comprises a halogen element including at least a material elected from the group consisting of HCl, HF, HBr, $Cl_2$, $F_2$, and $Br_2$.

24. A method according to claim 22, wherein said amorphous semiconductor film comprises a metal element being capable of promoting crystallization of said amorphous semiconductor film.

25. A method according to claim 24, wherein said semiconductor film has said metal element at $3 \times 10^{17}$ cm$^{-3}$ or less which is measured through SIMS.

26. A method according to claim 24, wherein said metal element can be reduced 1/10 or less of an initial concentration by said second heat treatment.

27. A method according to claim 22, wherein said first and second heat treatments are conducted by same means.

28. A method according to claim 22, wherein said second heat treatment is conducted for 10 minutes.

29. A method according to claim 22, wherein said spin density is measured by ESR.

30. A method according to claim 22, wherein said semiconductor device is one selected from the group consisting of a liquid crystal display device, an EL display device, and a thin film integrated circuit.

31. A method according to claim 22, wherein said amorphous semiconductor film is an amorphous silicon film formed through a low pressure CVD method or a plasma CVD method.

* * * * *